(12) United States Patent
Ferrara (10) Patent No.: US 7,699,574 B2
(45) Date of Patent: *Apr. 20, 2010

(54) WORK-PIECE PROCESSING SYSTEM

(75) Inventor: Joseph Ferrara, Middleton, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 301 days.

This patent is subject to a terminal disclaimer.

(21) Appl. No.: 11/765,499

(22) Filed: Jun. 20, 2007

(65) Prior Publication Data

US 2007/0243049 A1    Oct. 18, 2007

Related U.S. Application Data

(63) Continuation of application No. 10/826,419, filed on Apr. 16, 2004, now Pat. No. 7,246,985.

(51) Int. Cl.
*H01L 21/677*    (2006.01)
(52) U.S. Cl. ................. 414/217; 414/939; 414/221
(58) Field of Classification Search ........... 414/217, 414/221, 939
See application file for complete search history.

(56) References Cited

U.S. PATENT DOCUMENTS

| | | |
|---|---|---|
| 4,498,832 A | 2/1985 | Corville |
| 5,003,183 A | 3/1991 | Nogami et al. |
| 5,186,718 A | 2/1993 | Tepman et al. |
| 5,217,501 A | 6/1993 | Fuse et al. |
| 5,376,212 A | 12/1994 | Saiki |
| 5,405,230 A | 4/1995 | Ono et al. |
| 5,482,607 A | 1/1996 | Hashimoto et al. |
| 5,486,080 A | 1/1996 | Sieradzki |
| 5,695,564 A | 12/1997 | Imahashi |
| 6,024,800 A | 2/2000 | Soejima et al. |
| 6,350,097 B1 | 2/2002 | Mitchell et al. |
| 6,555,825 B1 | 4/2003 | Mitchell et al. |
| 6,647,665 B1 | 11/2003 | Tabrizi et al. |
| 6,746,195 B2 | 6/2004 | Shirai |
| 6,860,965 B1 | 3/2005 | Stevens |
| 6,877,946 B2 | 4/2005 | Kinnard et al. |
| 6,918,731 B2 | 7/2005 | Talmer |
| 6,977,014 B1 | 12/2005 | Stevens et al. |
| 7,010,388 B2 | 3/2006 | Mitchell et al. |
| 7,394,520 B2 * | 7/2008 | Klomp et al. ............ 355/30 |

* cited by examiner

*Primary Examiner*—Michael S Lowe
(74) *Attorney, Agent, or Firm*—Tarolli, Sundheim, Covell & Tummino LLP (57) ABSTRACT

A transfer system for use with a tool for processing a work-piece at low or vacuum pressure such as an ion implanter for implanting silicon wafers. An enclosure defines a low pressure region for processing of work-pieces placed at a work-piece processing station within the low pressure region. A two tier multiple work-piece isolation load lock transfers work-pieces from a higher pressure region to the lower pressure for processing and back to said higher pressure subsequent to said processing. A first robot transfers work-pieces within the low pressure region from the load locks to a processing station within the low pressure region. Multiple other robots positioned outside the low pressure region transfers work-pieces to and from the two tier work-piece isolation load locks from a source of said work-pieces prior to processing and to a destination of said work-pieces after said processing.

25 Claims, 9 Drawing Sheets

WORK-PIECE PROCESSING SYSTEM

RELATED APPLICATIONS

This application is a continuation of co-pending U.S. patent application Ser. No. 10/826,419, filed on Apr. 16, 2004.

FIELD OF THE INVENTION

The present invention concerns a system for moving a work-piece to and from an evacuated region of a tool that processes the work-piece at low or vacuum pressure.

BACKGROUND ART

Axcelis Technologies, assignee of the present invention, designs and sells products for processing of silicon wafers during integrated circuit fabrication. One such product or tool is sold under the designation MC-3. This tool creates an ion beam that modifies the physical properties of wafers that are placed into the ion beam. This process can be used, for example, to dope the silicon from which the unprocessed wafer is made to produce a semiconductor material. Controlled use of masking with resist materials prior to ion implantation as well as layering of different dopant patterns within the wafer produce an integrated circuit for use in one of a myriad of applications.

A variety of other tools are used during integrated circuit fabrication. These tools include rapid thermal processing of wafers under controlled conditions to anneal the wafers. Other tools are used to apply photoresist in controlled patterns onto the wafers. Tools are used to remove photoresist materials from the wafers during an ashing process. Other tools are used to cut the processed wafers into individual integrated circuits.

An ion implantation chamber of an ion beam implanter such as a model MC-3 implanter is maintained at reduced pressure. Subsequent to acceleration along a beam line, the ions in the beam enter the implantation chamber and strike the wafer. In order to position the wafer within the ion implantation chamber, they are moved by a robot into a load lock from a cassette or storage device delivered to the implanter by a conveyor system or by other means of delivery.

U.S. Pat. No. 5,486,080 to Sieradzki concerns a system for high speed movement of work-pieces in vacuum processing. The system employs two wafer transport robots for moving wafers from two load locks past a processing station. Additional patents relating to serial end stations are U.S. Pat. No. 6,350,097, U.S. Pat. No. 6,555,825, and U.S. Pat. No. 5,003,183.

SUMMARY OF THE INVENTION

An exemplary system built in conformity with the invention relates to an ion implanter end station. The implanter processes a work-piece at low or vacuum pressure. The implanter has transfer apparatus for transferring work-pieces into and out of an enclosure defining a low pressure region for processing of work-pieces by a work-piece process module.

Two adjacent work-piece isolation load locks are provided. Each load lock includes two access openings for selectively communicating atmospheric pressure to a load lock interior for transferring work-pieces to and from atmospheric pressure. A third access opening of the load lock permits transfer of work-pieces within the load lock interior to lower pressure for processing and back to a higher pressure subsequent to the processing.

A first robot transfers work-pieces from the adjacent work-piece isolation load locks to a process module within the low pressure or vacuum region. Multiple other robots positioned outside the low pressure region transfer work-pieces to and from the adjacent work-piece isolation load locks from a source of the work-pieces prior to processing and to a destination of the work-pieces after processing.

These and other features of the invention will be understood from a review of a detailed description of an exemplary embodiment of the invention which is described in conjunction with the accompanying drawings.

EXEMPLARY EMBODIMENT FOR PRACTICING THE INVENTION

Figure 1:
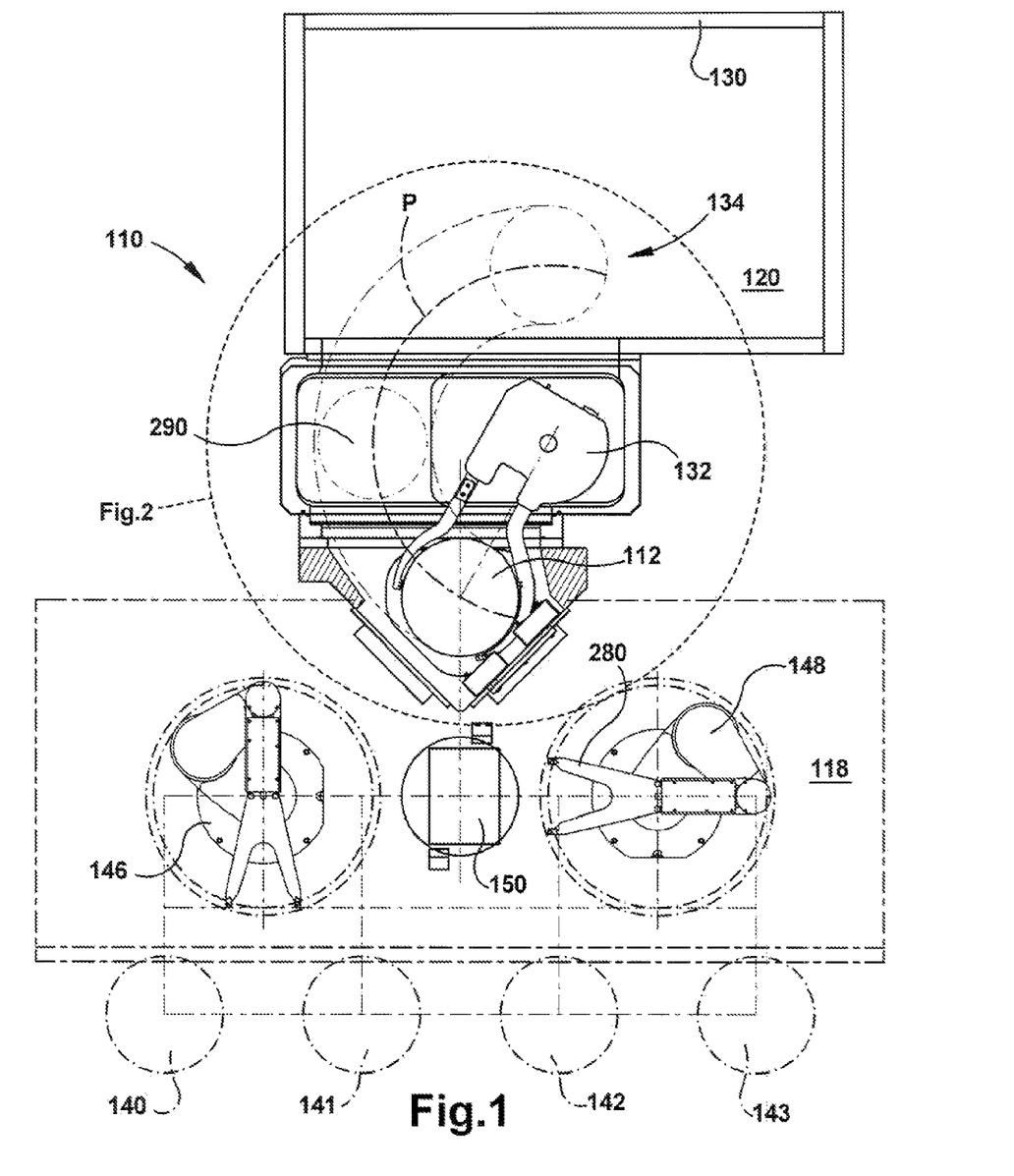
FIG. 1 is a top view of an ion implanter end station for loading work-pieces into an ion implanter and removing processed work-pieces from an ion implanter.
Figure 3:
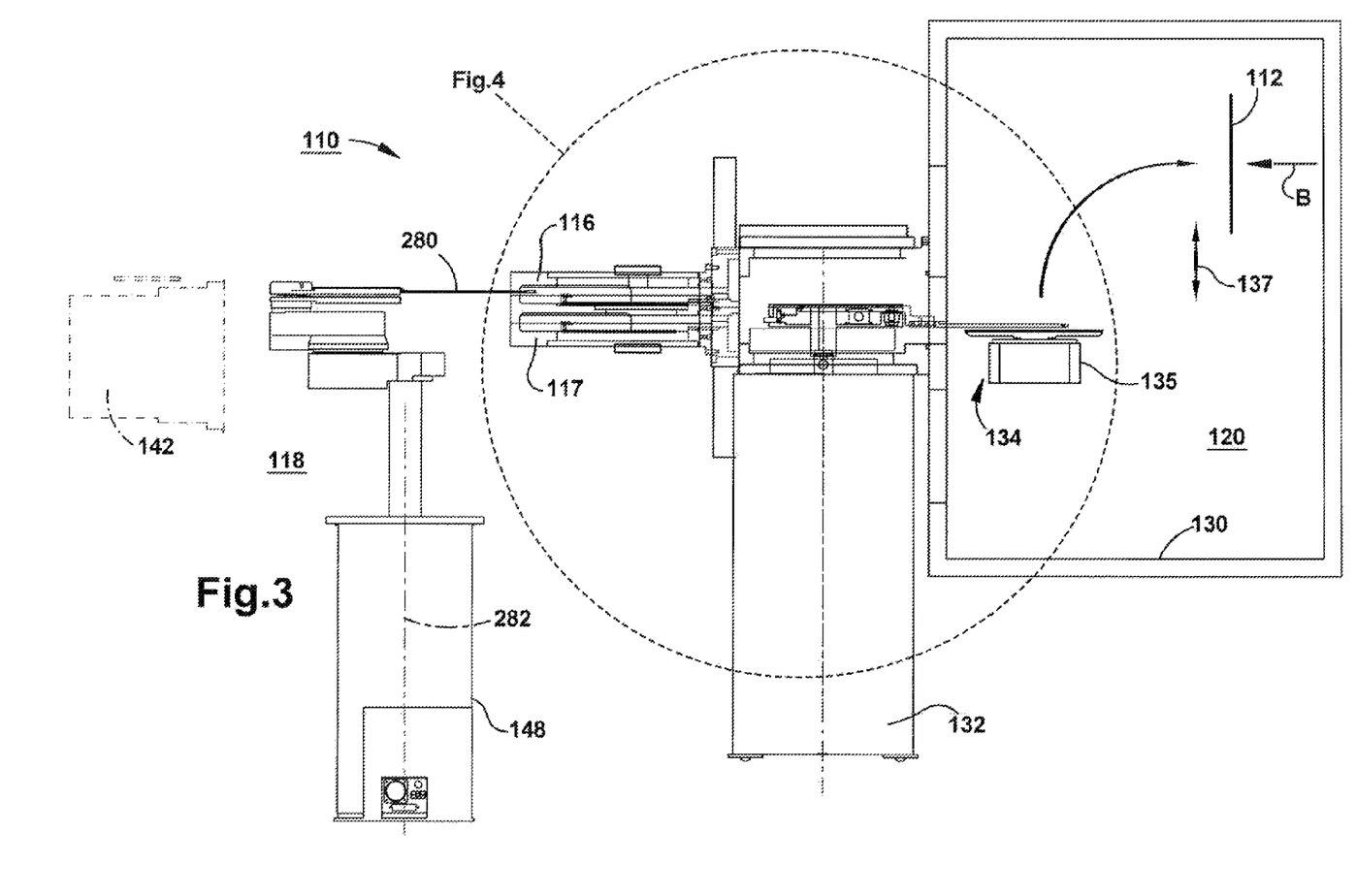
FIG. 3 is a schematic depiction showing an in vacuum robot positioned with respect to upper and lower load locks for transferring work-pieces at an ion implantation end station.

Turning now to the drawings, FIGS. 1 and 3 depicts an end station 110 for use with a ion beam processing tool for processing a work-piece, such as a semiconductor wafer 112 at low or vacuum pressure. The end station includes two work-piece isolation load locks 116, 117 (FIG. 3) for transferring work-pieces (typically semiconductor wafers) from a region 118 of higher pressure (typically atmospheric pressure) to a region 120 of lower pressure and back to the region 118 of higher pressure. In the depicted exemplary embodiment the two load locks 116, 117 are stacked one on op of the other.

One application of the end station depicted in FIG. 1 is for serially implanting one semiconductor wafer at a time with ions from an ion beam B that enters an ion implantation chamber 130 having an interior at the lower pressure. A robot 132 is positioned for removing work-pieces from one of the two load locks 116, 117 and placing them into the ion implantation chamber 130. The robot 132 can transfer the wafers from either of the two load locks 116, 117 and deliver them to a wafer chuck at a transfer station 134. At the transfer station 134, the robot 132 places the wafer onto a wafer chuck 135 which attracts the work-piece and secures it in place on the chuck. Such wafer chucks are known in the prior art. The chuck and work-piece are then rotated into a position for work-piece implantation by ions that make up the ion beam B.

After the chuck 135 is rotated through an angle of approximately ninety degrees (to vertically orient the wafer or workpiece 112 as seen in FIG. 3) the wafer is scanned back and forth as indicated by the arrow 137 through the ion beam B within the implantation chamber 130.

In accordance with an exemplary embodiment of the invention, the ion beam B is scanned from side to side by electrodes (not shown) up stream along an ion beam path before the ions reach the ion implantation chamber 130. Other means of implanting a wafer without resort to side to side scanning are also known in the art. The side to side scanning creates a fan shaped beam. This shape in combination with the scanning of the work-piece up and down as indicated by the arrow 137 processes an entire surface of the work-piece that faces the ion beam.

After beam processing by the ion beam (which takes on the order of a few seconds) the wafer chuck is rotated back to the transfer station and the robot 132 retrieves the work-piece and moves the processed work-piece back into one of the load locks 116, 117 for transfer back to the higher pressure region 118. In the disclosed embodiment, the robot 132 includes two active edge grip end effectors each of which has two arms, wherein either end effector can be used to grasp the work-piece within the load lock and move in an arcuate path P (FIG. 1) with respect to the load locks 116, 117 as it moves the work-piece to the transfer station.

The exemplary embodiment of the invention is used in conjunction with an ion implanter for ion beam processing of semiconductor wafers in an integrated circuit fabrication facility. FIG. 1 schematically depicts four front opening unified pods 140-143 used to move silicon wafers from one tool to another in such an integrated circuit (IC) fabrication facility. An overhead transport (not shown) has deposited each of these four pods to a position in relation to the end station 110 within the reach of one of two in-air robots 146, 148 so that a robotic arm can extract one or more silicon wafers from a pod for processing. The in-air robot that grasps a wafer and places it onto an aligner 150 which orients the wafer in a proper orientation prior to inserting the wafer into one of the two load locks 116, 117.

Figure 2:
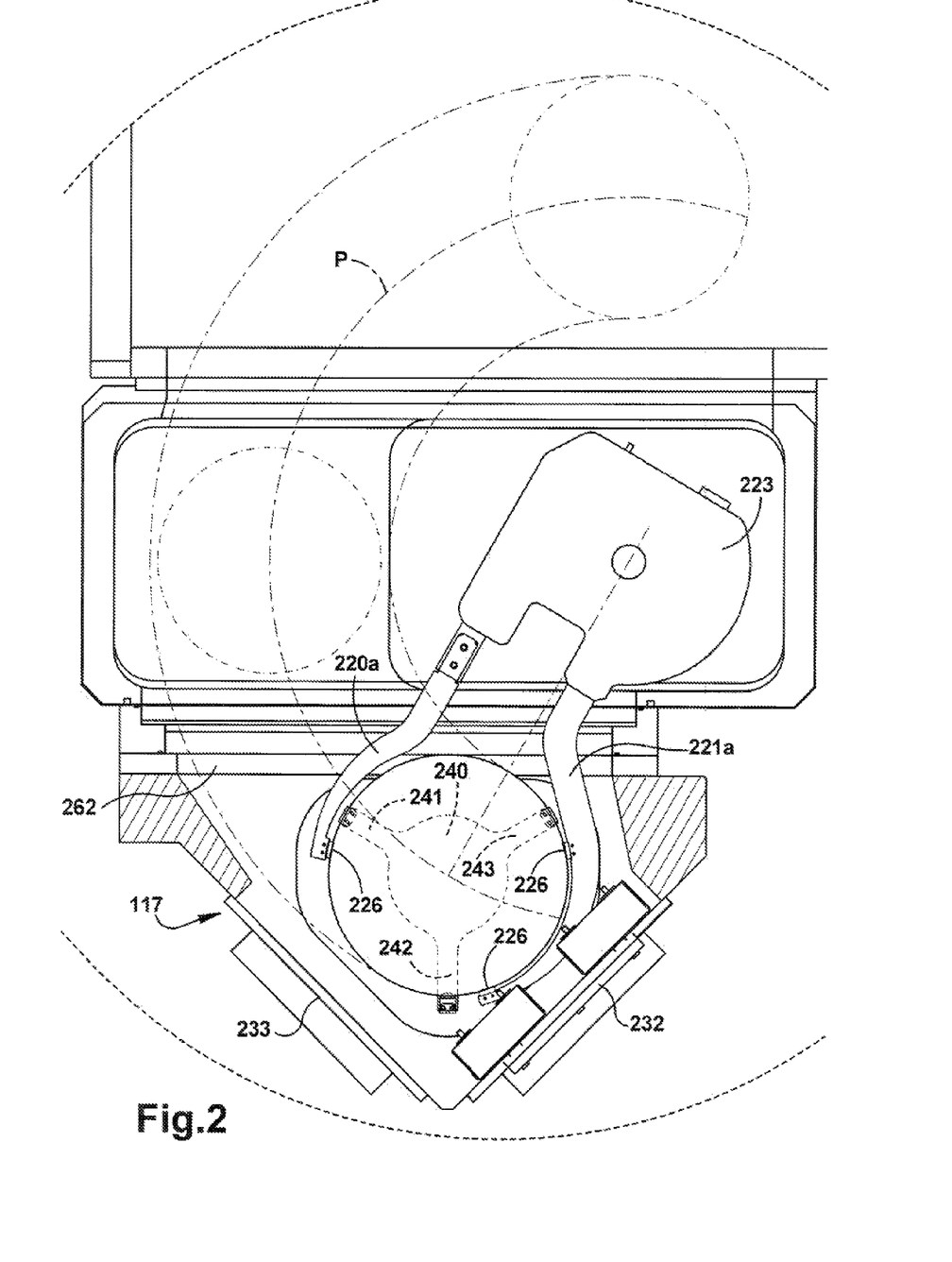
FIG. 2 is an enlarged depiction of a portion of the FIG. 1 end station.
Figures 4, 4B:
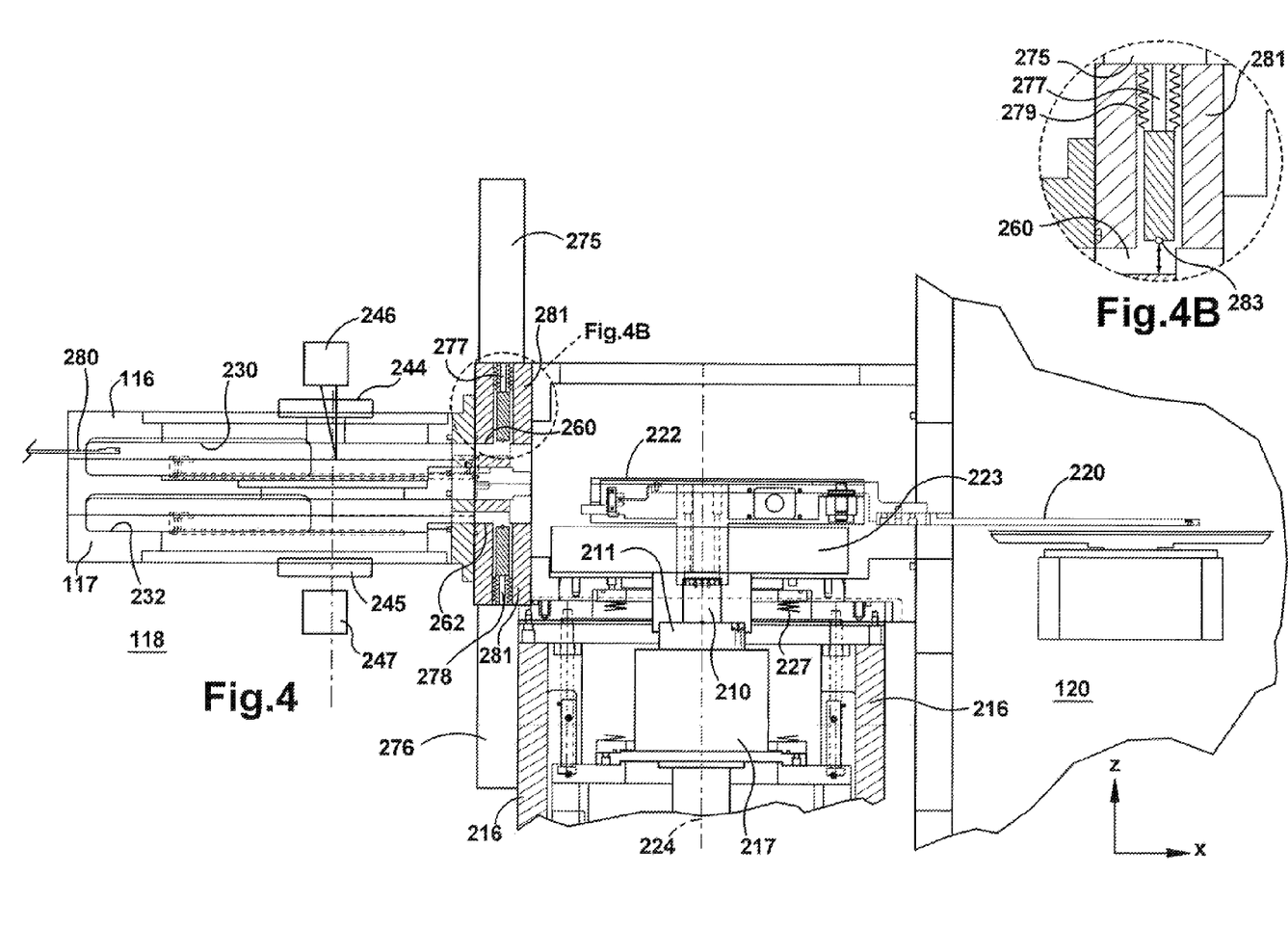
FIG. 4 is an enlarged depiction of a portion of the in vacuum robot depicted in FIG. 3.
FIG. 4B is an enlarged depiction of a gate valve used to allow an in vacuum robot to gain access to a load lock interior.
Figure 4A:
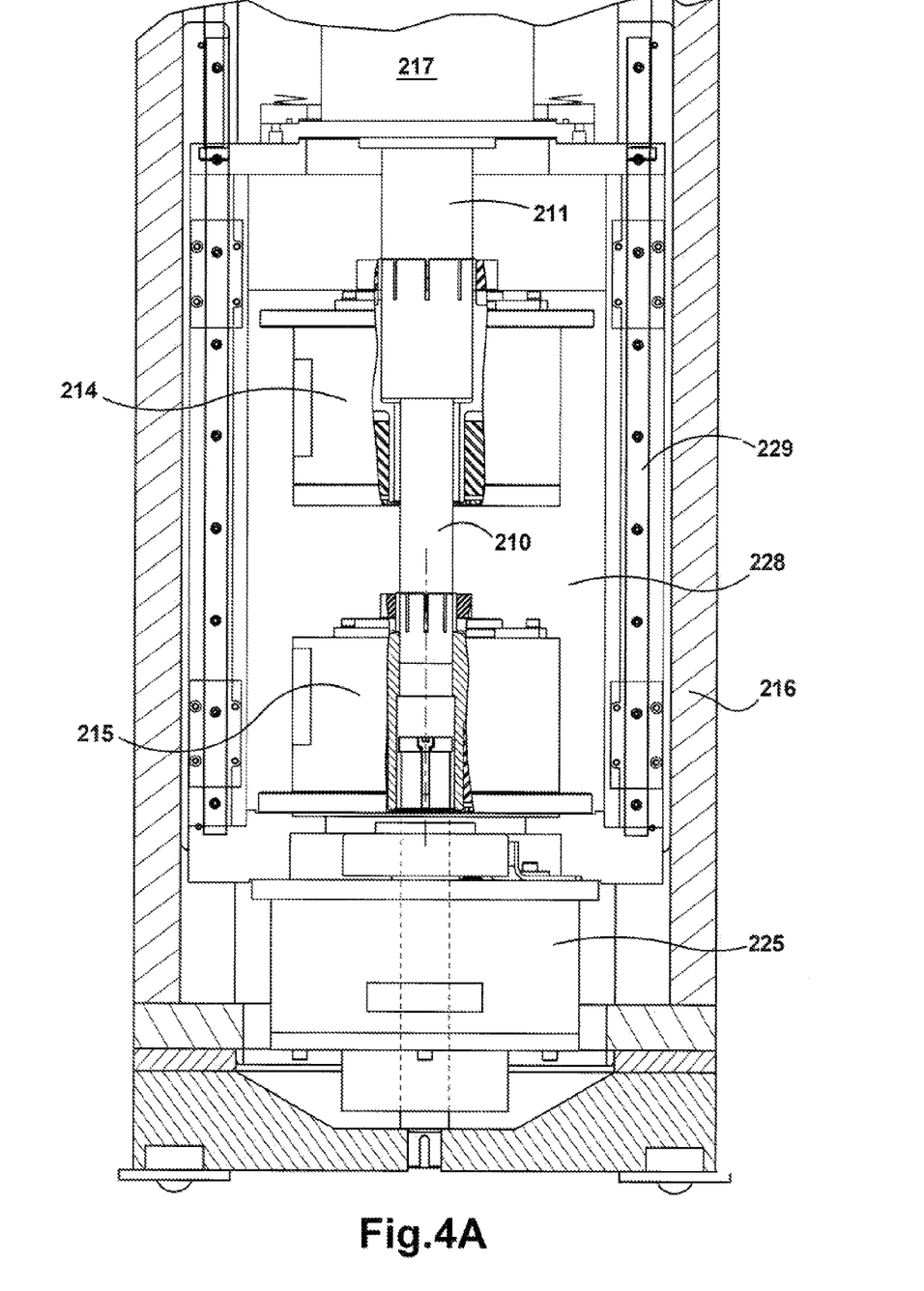
FIG. 4A is an enlarged depiction of a robot housing supporting motors within the housing that rotate robot arms for transferring work-pieces from the load locks to a processing module.

The side views of FIGS. 3, 4, and 4A illustrate details of the in-vacuum robot 132 that moves wafers into the lower pressure region 120 from the load locks 116, 117. The robot 132 includes two concentric, generally vertically oriented drive shafts 210, 211 coupled to motors 214, 215 (FIG. 4A) supported within a robot housing 216. The drive shafts are supported by and pass through a ferro fluidic seal 217 at the top of the housing 216. An inner drive shaft 210 is rotated by the motor 215 to selectively orient a first end effector having robotic arms 220, 221 extending radially from an upper support 222 to controlled positions about a center axis 224. A second lower support 223 is connected to the drive shaft 211 and supports a second end effector having arms 220a, 221a for controlled rotation about the center axis 224. In the partial section view of FIG. 2, the shaft 211 has been rotated to position the arms 220a, 221a in a position to grasp a wafer within the bottom or lower load lock 117. In the side depictions of FIGS. 3 and 4 the top end effector arms 220, 221 have been rotated by controlled actuation of the motor 215 to a position for depositing the wafer onto the chuck 135 at the transfer station.

A pneumatic actuator (not shown) in the robot cause one pivoting arm 220 to pivot with respect to a fixed arm 221 and can be controllably actuated (by a controller 200 that co-ordinates the movements of wafers through the end station 110 depicted in FIG. 1) to grasp a wafer between the pivoting arm 220, for example, and the fixed arm 221. When the pivoting arm 220 moves into contact with a wafer such as the wafer 112, contact pads 226 coupled to the two arms engage a wafer at three points along the edge of the wafer. Once the wafer is grasped by the arms, the motor coupled to that end effector arms can rotate the wafer to a new position in relation to a center axis of rotation 224 of the robot 132.

As illustrated in FIG. 4A, the motors 214, 215 and associated drive shafts 210, 211 are coupled to a carriage 228 that allows both end effectors to be simultaneously moved up and down in the 'z' direction as defined in FIG. 4. This is accomplished by a motor 225 (FIG. 4A) having an output shaft coupled to a ball screw that is coupled to the carriage 228. Controlled energization of the motor 225 by the controller 200 moves the carriage 228 up and down on a linear track 229. Controlled movement of the carriage 228 up and down in the z direction at a park or holding position 290 (FIG. 1) allows either of the robot's two end effectors to move into either load lock. Stated another way, the arms 220, 221 of the first end effector can be inserted into either load lock 116, 117 to grasp a wafer and the arms 220a, 221a of the second end effector can also be inserted into either load lock 116, 117. To then move the wafer to the processing module at the transfer station within the implantation chamber, the wafer may again be repositioned in the z direction if it is withdrawn from the top load lock 116.

Turning to FIG. 4, the ferro fluidic seal 217 is bounded around its periphery by a bellows 227 coupled to the carriage 228 that expands and is compressed as the motor moves the supports 222, 223 up and down to position the arms in the z direction. These bellows 227 allow the region radially outside the bellows to remain at atmospheric pressure while the region through which the wafers rotate back an forth between the transfer station and the load locks remains evacuated at low or vacuum pressure.

The load locks 116, 117 each have two openings that face the high pressure region for insertion of unprocessed wafers and withdrawal of a processed wafer from the loadlock. The top load lock 116 includes two openings 230, 232 which are opened and closed by sealing doors that are clamped against outwardly facing surfaces of the load locks at appropriate times during the implantation process by the controller 200. In a similar manner the bottom load lock 117 has two openings 232, 233 which are opened and closed by sealing doors that are clamped against outwardly facing surfaces of the load locks at appropriate times during the implantation process.

To place a wafer into a load lock, an appropriate gate valve or door must be moved away from its corresponding opening and a wafer inserted into the load lock by one of the two atmosphere robots 146, 148. In the side view of FIG. 4, the load lock openings 230, 232 are illustrated and an end effector 280 of the robot 148 is shown positioned in relation to an opening 230 in the top load lock. The end effector 280 inserts a wafer into the load lock and places the wafer onto a spider support 240 having radially extending arms 241, 242, 243 (FIG. 2) that support the wafer in a position that allows the wafer to be grasped by end effector of the in vacuum robot 132. To grasp a wafer and move the wafer to the transfer station, the robot arms rotate through an appropriate one of two access openings 260, 262 as seen in FIG. 4.

As seen in the side view of FIG. 4, the load locks include two transparent windows 244, 245 next to which are positioned two optical sensors 246, 247 for monitoring a transfer of wafers into the load lock. The sensors check for both presence and alignment of the wafer on the spider support 240 and transmit signals back to the controller 200.

Figure 5:
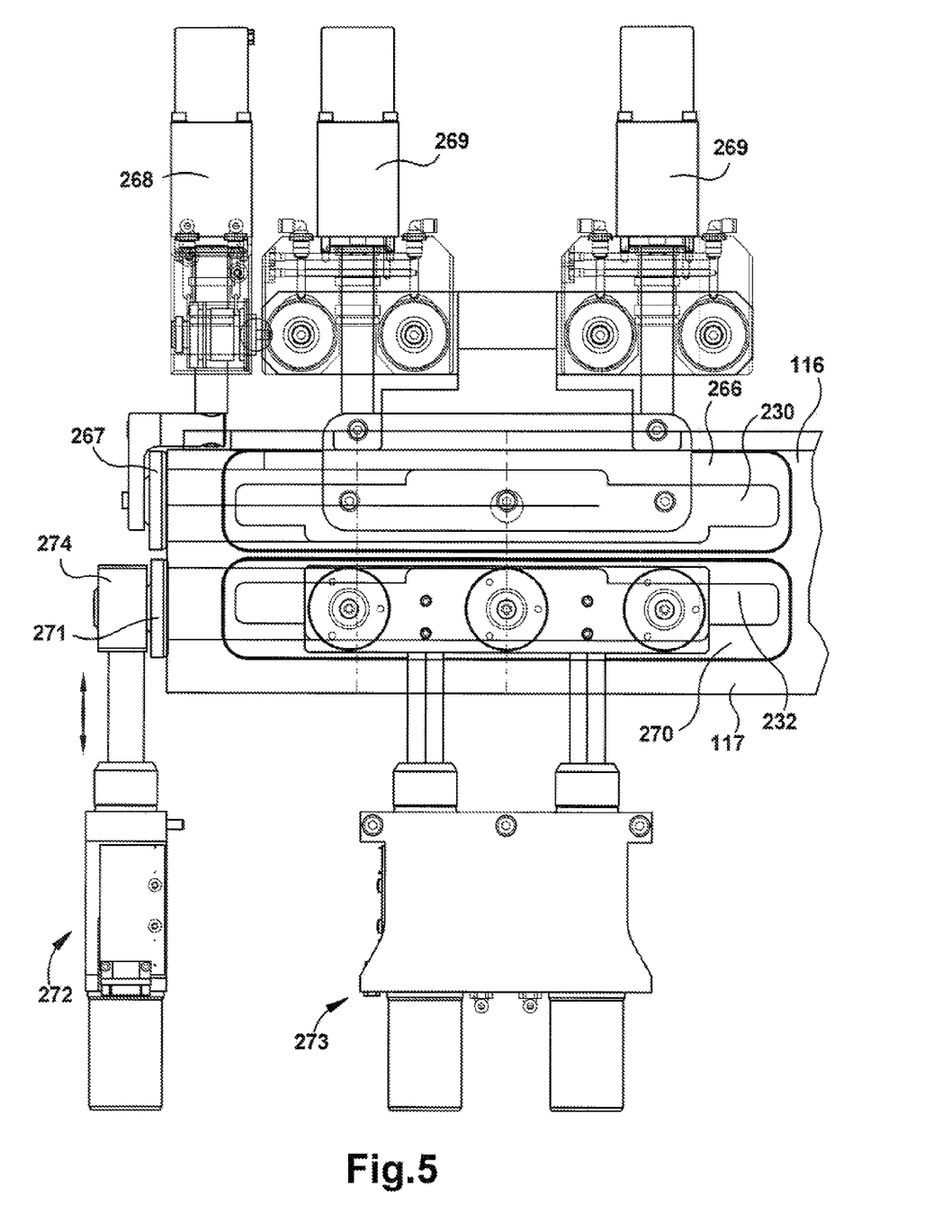
FIG. 5 is a side view of adjacent top and bottom load locks and vacuum isolation valves for allowing work-piece movement into and out of the load locks.

FIG. 5 illustrates the top and bottom load locks 116, 117 and structure for opening and closing the load locks to allow insertion and withdrawal of wafers by the in air robots. The top load lock has two gate valves 266, 267 that include plates that are angled at approximately 90 degrees with respect to each other and are coupled to pneumatic actuators 268, 269. The fact that the plates are so angled means that either robot 146, 148 can gather or deliver wafers from and to the load lock. Similarly, the bottom load lock has two valves 270, 271 coupled to associated pneumatic actuators 272, 273. Each of the valves seats within a respect one of the openings in the load lock and includes a peripheral seal that extends around the plate to assure an air tight engagement between a plate and its respective opening. To allow a wafer to be inserted into an opening the plate is first moved away from its opening in a direction generally normal to an outer surface of the load lock. This outward movement is accomplished by a piston 274 (for example) coupled to the plate. Once the plate is sufficiently spaced from the opening by the piston, its associated actuator moves the associated plate transversely along a path away from the load lock a sufficient distance from the load lock so that the in air robot end effector 280 can insert a wafer into the access opening of the load lock and deposit the wafer onto the spider support 240. The cover plate of the valve 271 moves downward as depicted by the up and down arrow depicted in FIG. 5. Movement of a plate to seal and unseal an opening is accomplished by controlled actuation of the piston of a specified actuator by the controller 200.

On the vacuum side of the load locks, the system includes top and bottom actuators 275, 276 coupled to gate valves 277, 278. The valves and actuators are supported by a valve housing 281. (See FIGS. 4 and 4B) The valve housing 281 is interposed between the load locks 116, 117 and the robot housing 216. The hate valves 277, 278 move up and down in the z direction to open and close the access openings 269, 262 into the load lock interior though which the robot arms rotate to move the wafers into and out of the region of vacuum. As seen in FIG. 4B, the gate valve 277 has a piston and plate that in tun supports a seal 283 which sealingly engages a surface of the gate valve housing 281 which defines the opening 260. A bellows 270 surrounds the piston of the gate valve to allow the actuator 275 of the load lock to be at atmosphere while the gate is at low or vacuum pressure.

The in air robot 148 is of a different design from the design of the robot 132. The in air robot 148 has an end effectors 280 that can cause the work-piece supported by the end effector to translate radially in an out with respect to a center 282 of the robot 148. These end effectors 280 can also pivot around the robot center 282. When the door or cover 266 to the load lock is open, the end effector moves a wafer into the load lock and deposits that wafer onto the spider support 240. The robot 148 is a SCARA (selective compliance assembly robot arm) type robot known in the semiconductor processing industry.

Figure 6:
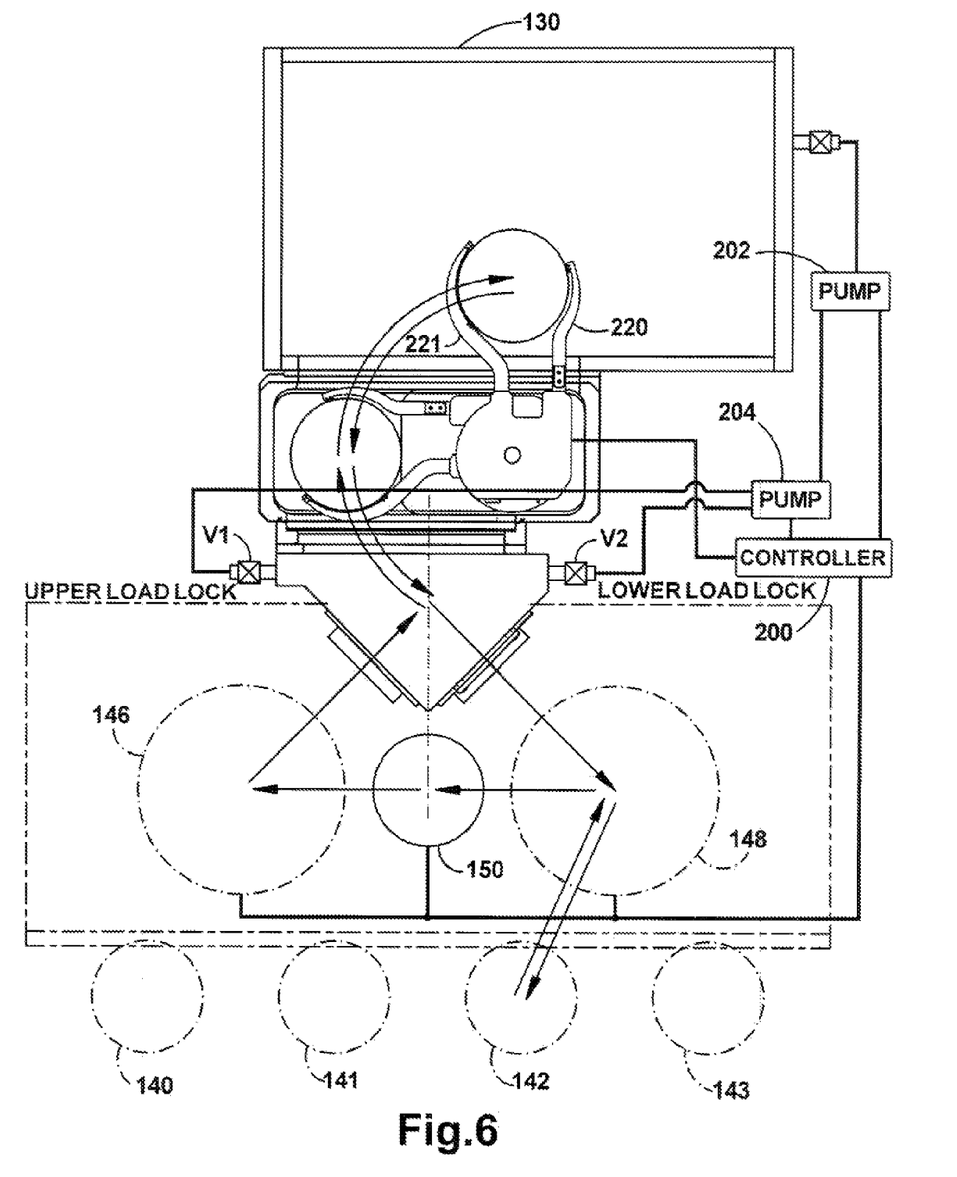
FIGS. 6 and 7 show sequences of work-piece movements before and after beam processing of those work-pieces.

At a position intermediate the two load locks 116, 117 and the transfer station, the end station 110 includes a park station 290 where the robot can temporarily park a wafer in its grasp. In an appropriate circumstance both end effectors can be rotated to move to this park station 290 either with or without wafers grasped by the arms. In the depiction of FIG. 6, the bottom end effector of robot arms 220a, 221a is parked in this position with a wafer in its grasp. Movement to the park station would be an important initial step before simultaneous up or down movement of the two end effectors of robot arms in response to controlled actuation of the motor 225.

Figure 8:
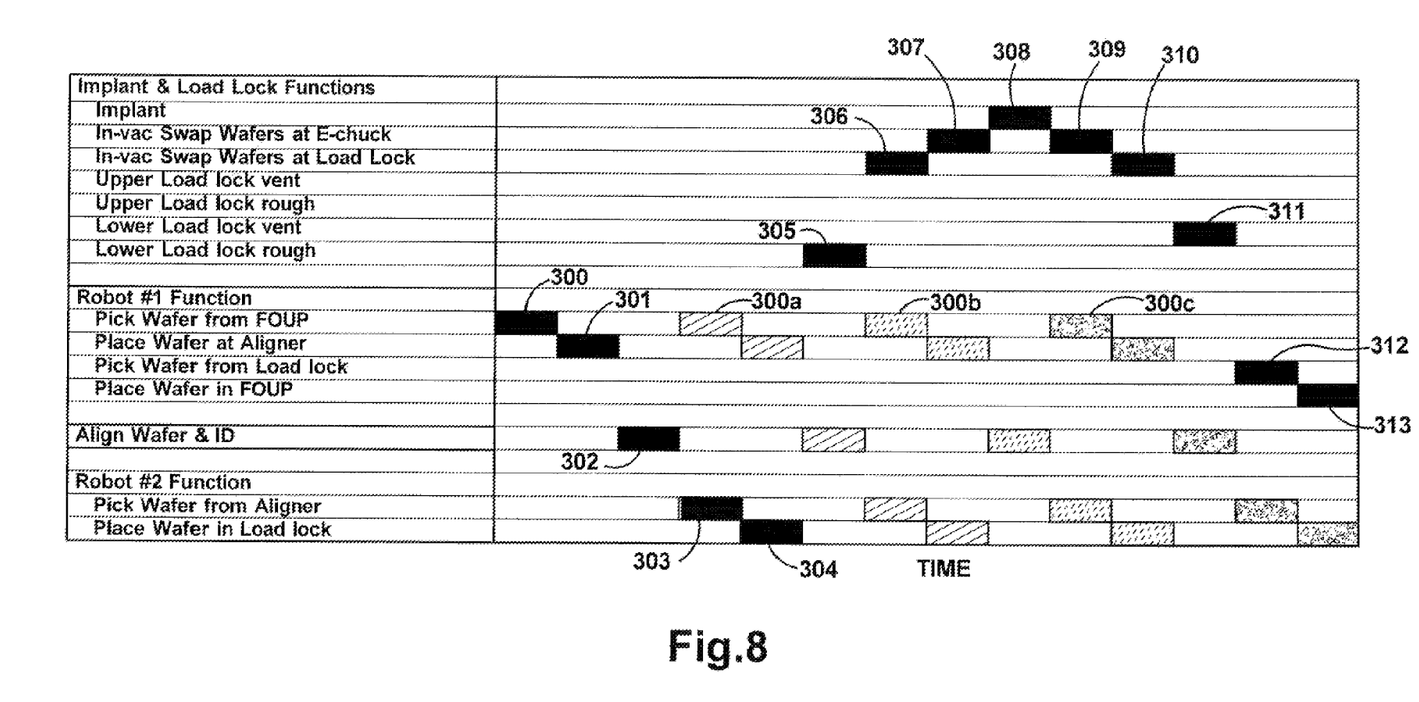
FIG. 8 is a chart showing a representative progress of stages or positions through which work-pieces progress in the end station of FIG. 1.

FIG. 6 depicts a sequence of processing movements or wafer paths (arrows in the FIG. 6 depiction) for serially processing multiple work-pieces at low or vacuum pressure at the implanter end station 110. This sequence of steps is also shown in the chart of FIG. 8. As a first step in this depiction, the robot 148 gathers or picks 300 (FIG. 8) a wafer from a FOUP 142 positioned at the higher (atmospheric) pressure region 118. The robot 148 moves the wafer from the FOUP 142 and places 301 it on the aligner 150. The aligner then aligns 302 the wafer. In the FIG. 6 depiction a second in air robot 146 retrieves or picks 303 the wafer from the aligner 150 and moves it to a first, lower load lock 117 and places 304 the unprocessed wafer into the load lock 117. The load lock 117 is coupled to a valve V2 that connects an interior of the load lock to a pump 204 which lowers 305 the pressure in the load lock after the cover 270 has been placed over the opening 232. (See FIG. 5) Note, that the fact that the load lock 117 is pumped down does not mean the top load lock 116 needs to be at a particular pressure since the top load lock 116 is coupled to a separately actuable valve V1 and the two load locks are isolated from each other.

The load lock 117 is evacuated by the pump 204 to reduce the pressure within the first loadlock. Once the load lock 117 is evacuated to low pressure or vacuum, the valve plate 278 (FIG. 4) is opened by the actuator 276. The in-vacuum robot 132 moves one end effector into the load lock 117 to remove 306 the unprocessed wafer from within the interior of the load lock. In the FIG. 6 depiction, one end effector having arms 220, 221 retrieves the wafer from the load lock 117 and rotates it through the arcuate path P to the workpiece processing module 134 where the robot deposits or delivers 307 the wafer to the wafer chuck. The second end effector having arms 220a, 221a of the in-vacuum robot 132 is depicted as having previously removed a wafer that has been processed from the chuck at the processing module inside the ion implantation chamber 130.

After ion implantation 308 of the wafer by the beam B, the robot 132 retrieves 309 the wafer and returns it via the arcuate path P and places 310 the processed work-piece into the bottom load lock 117. The controller 200 then vents 311 the bottom load lock 117 by means of the valve V2 and the in air robot 148 picks up 312 the processed work-piece from the bottom load lock 117 and places it 313 back into to the FOUP 142.

The sequence of transfer paths is repeated for each subsequent unprocessed wafer gathered from the FOUP 142. When the load lock 117 is vented to allow a processed wafer to be moved back to the FOUP 142, the robot 146 can place an untreated wafer into the bottom load lock 117 subsequent to removal of the treated wafer. Similarly, when a wafer that remains to be treated is removed from a load lock, an already treated wafer can be inserted into that evacuated load lock by a second end effector of in vacuum robot arms.

As depicted in FIG. 8, multiple wafers are simultaneously in transit along the paths of FIG. 6. Three other wafer implant sequences are started (at stages 300a, 300b, 300b) before a treated wafer is delivered 313 back to the FOUP 142. The wafers alternate between the two load locks so that during the next sequence beginning with the picking 300a of a wafer from the FOUP 142 the wafer is delivered to the top load lock 116. In the illustrated embodiment the wafers pass into vacuum through the same load lock through which they exit the vacuum subsequent to ion beam processing although this is not a requirement for practice of the invention. Experience with the exemplary embodiment has shown that if a complete round trip from FOUP 142 back to the FOUP 142 is T seconds, then simultaneously movement of four wafers decreases the average time per wafer to T/4 seconds.

The FIG. 8 depiction is intended to show a sequence of stages in which the wafer passes. The x axis of this figure corresponds to increasing time. Although the different stages are shown of equal length it should be appreciated that the different stages typically do not take the same amount of time and during practice of the exemplary embodiment unequal times for these stages are experienced.

Figure 7:
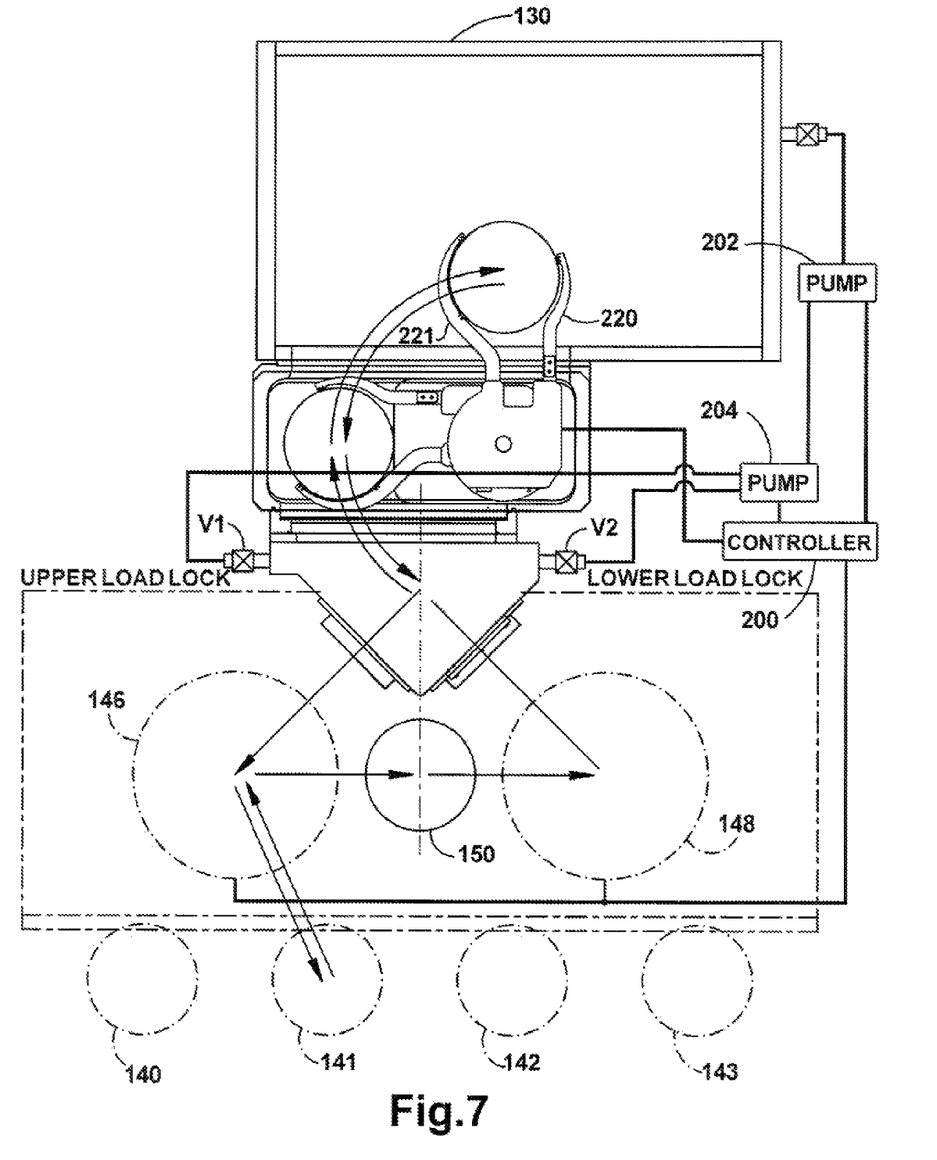

FIG. 7 depicts an alternate sequence of processing movements or wafer paths (arrows in the FIG. 7 depiction) for serially processing multiple work-pieces at low or vacuum pressure at the implanter end station 110. The robot 146 gathers a wafer from a FOUP 141 positioned at the higher (atmospheric) pressure region 118. The robot 146 moves the wafer from the FOUP 141 to the aligner 150. A second in air root 148 retrieves the wafer from the aligner 150 and moves it to a first, top load lock 116 and places the unprocessed wafer into the load lock 116.

The first load lock 116 is evacuated by the pump 204 to reduce the pressure and once evacuated, the valve plate 277 is opened by the actuator 275. The in-vacuum robot 132 moves one end effector into the load lock 116 to remove the unprocessed wafer from within the interior of the first load lock.

After beam processing, the robot 132 retrieves the wafer and returns it via the arcuate path P and places the processed work-piece into the second, bottom load lock 116. The controller 200 then vents the second load lock 116 by means of the valve V1 and the in air robot 146 removes the processed work-piece from the bottom load lock 116 for transfer back to the FOUP 141. A common feature of each of the transfer paths shown in FIGS. 6 and 7 is the movement through the aligner 150 on the way to the load lock.

The invention has been described with a degree of particularity. The times shown in Table 1 are not intended to limit the scope of this information nor should the sequence of processing steps limit the invention. It is the intent that the invention include all modifications and alterations from the disclosed exemplary embodiment falling within the spirit or scope of the appended claims.

The invention claimed is:

1. For use with a tool for processing work-pieces at low pressure, a work-piece transfer system comprising:
    a) a first isolation load lock for transferring work-pieces from a higher pressure region to a lower pressure region and back to said higher pressure region;
    b) a second isolation load lock positioned next to the first work-piece isolation load lock for transferring other work-pieces from a higher pressure region to a lower pressure region and back to said higher pressure region;
    c) a work-piece processing station for processing work-pieces at low pressure;
    d) a robot for transferring work-pieces from one of said first and second work-piece isolation load locks to the work-piece processing station; and
    e) wherein said first and second isolation load locks are housed within a load lock housing, said load lock housing including two load lock access openings facing said higher pressure region at different angles to allow each of the first and second load locks to be accessed from two different directions from the higher pressure region.

2. The transfer system of claim 1 additionally comprising a work-piece aligner for controlling an alignment of work-pieces moved through the first and second work-piece isolation load locks.

3. The transfer system of claim 1 wherein said load lock housing includes a support for supporting a work-piece placed on the support within the housing interior; and a control valve for selectively venting a load lock housing interior to atmosphere and to a vacuum source for lowering the pressure within the load lock housing interior.

4. The transfer system of claim 1 wherein the first and second isolation load locks are spaced vertically from each other and wherein the robot includes two spaced apart end effectors that can be moved into the first and second isolation load locks to obtain a work-piece.

5. The transfer system of claim 4 wherein the spaced apart end effectors can be raised and lowered in relation to the load locks to allow either end effector to move into either of said first or second load locks.

6. For use with a tool for processing a work-piece at low pressure, transfer apparatus comprising:
    a) an enclosure defining a low pressure region for processing of work-pieces at a work-piece processing station within the low pressure region;
    b) two adjacent work-piece isolation load locks wherein each load lock includes:
        i) two access openings for selectively communicating atmospheric pressure to a load lock interior for transferring work-pieces to and from a region of atmospheric pressure wherein said two access openings confront said region of atmospheric pressure at different angles, and
        ii) a third access opening for transferring work-pieces within the load lock interior to lower pressure for processing and back to said higher pressure subsequent to said processing;
    c) a first robot for transferring work-pieces form the adjacent work-piece isolation load locks to the work-piece processing station within the low pressure region; and
    d) multiple other robots positioned in said atmospheric region outside the low pressure region for transferring work-pieces to and from the adjacent work-piece isolation load locks from a source of said work-pieces prior to processing and to a destination of said work-pieces after said processing wherein each of said multiple other robots is aligned with at least one of said access openings.

7. The transfer apparatus of claim 6 wherein the adjacent work-piece isolation load locks are positioned one on top of the other.

8. The transfer apparatus of claim 7 wherein the two access openings of a load lock open to allow work-pieces to be inserted along different travel paths and placed on a load lock support.

9. The transfer apparatus of claim 6 wherein the first robot moves the work-pieces in an arc to a transfer station.

10. The transfer apparatus of claim 9 wherein the first robot has two end effectors, wherein each end effector can actively grasp a work-piece in either load lock.

11. The transfer apparatus of claim 10 wherein the load locks are positioned one on top of the other and the work-pieces are generally flat wafers and further wherein the two end effectors move up and down along a direction transverse to a plane of the generally flat wafers.

12. The transfer apparatus of claim 11 wherein the two end effectors are coupled to a movable carriage that moves the two end effectors simultaneously.

13. A process for serially processing multiple work-pieces at low pressure comprising:
    providing a low pressure robot having two end effectors for moving work-pieces to a processing station from first and second load locks positioned adjacent to each other;
    moving an unprocessed work-piece to a first load lock through a first atmospheric load lock access opening and placing the unprocessed work-piece inside the first load lock;
    lowering the pressure within the first load lock;

removing the unprocessed work-piece from the first load lock with one end effector of said low pressure robot and moving the unprocessed work-piece to a processing station;

placing an already processed work-piece obtained from the processing station with a second end effector of said low pressure robot into one load lock of said first or second load locks;

raising the pressure within the one load lock; and removing the processed work-piece from the one load lock through a second atmospheric load lock access opening wherein the first and second atmospheric load lock access openings comprise two atmospheric openings that are located at an angle with respect to each other for allowing work-pieces to be inserted into each load lock from different directions from an atmospheric side of said load lock.

14. The process of claim 13 wherein a processed work-piece is placed into the one load lock at the same time an unprocessed work-piece is being processed at the processing station.

15. The process of claim 14 wherein the work-piece is a semiconductor wafer and wherein the low pressure robot delivers the wafer for placement onto a wafer chuck that attracts the wafer and further comprising reorienting the wafer and chuck prior to processing.

16. The process of claim 13 comprising positioning the first load lock above the second load lock.

17. The process of claim 16 comprising moving the two end effectors of the low pressure robot up and down to enable either end effector to access work-pieces within either the first or second load locks.

18. The process of claim 17 wherein the two end effectors are mounted collinearly to each other on a carriage that supports a drive motor for independently activating each end effector and further comprising moving the carriage up and down with respect to the load locks to appropriately position an end effector with respect to a load lock.

19. The process of claim 13 wherein the first and second atmospheric load lock access openings are located at an angle with respect to each other for allowing work-pieces to be inserted into a load lock from different directions from an in air side of said load lock and further comprising positioning multiple in air robots for moving work-pieces into and out of said load locks.

20. The process of claim 13 wherein the work-piece is a generally planar wafer and additionally comprising aligning an orientation of the wafer prior to inserting an unprocessed wafer into a load lock.

21. The process of claim 20 additionally comprising providing first and second in air robots for moving the generally planar wafers to and from the load lock and wherein a first in air robot gathers a wafer from a source of wafers, places an unprocessed wafer onto an aligner for orientation and wherein a second in air robot removes an aligned wafer from the aligner for transfer through a load lock to the processing station.

22. The process of claim 13 wherein one or more additional unprocessed work pieces are moved sequentially from a source by an in air robot to the first and second load locks prior to removal of the processed work piece from the one load load.

23. The process of claim 22 wherein alternate ones of the additional unprocessed work pieces are placed into alternate load locks of said first and second load locks to allow a predecessor work piece to be removed from a pumped down load lock while an alternate load lock is opened to atmosphere for receipt of an unprocessed work piece.

24. The process of claim 13 wherein a given work piece is removed after processing from the same load lock into which said given work piece was placed prior to processing.

25. Apparatus for serially processing multiple work-pieces at low pressure comprising:

first and second load locks located adjacent to each other and housed within a load lock housing, said load lock housing including two load lock access openings facing a higher pressure region at different angles to allow each of the first and second load locks to be accessed from two different directions from said higher pressure region;

a first low pressure robot having two end effectors which rotate about a robot center axis for moving work-pieces from the first and second loadlocks to a processing station;

a second in air robot for moving an unprocessed work-piece to a first loadlock and placing the unprocessed work-piece inside the first loadlock;

a pump for evacuating the first loadlock to reduce the pressure within the first loadlock; and a controller for causing the first robot to remove the unprocessed work-piece from the first loadlock with one end effector of said first robot and placing a processed work-piece obtained from the processing station with a second end effector of said first robot into the second loadlock prior to pressurizing the second load lock.

* * * * *